(12) United States Patent
Chopra et al.

(10) Patent No.: US 8,062,698 B2
(45) Date of Patent: Nov. 22, 2011

(54) SYNTHESIS OF CONDUCTIVE METAL MARKINGS FOR CHIPLESS RFID APPLICATIONS

(75) Inventors: Naveen Chopra, Oakville (CA); Peter M. Kazmaier, Mississauga (CA); Dominique J. Lalisse, Palmyra, NY (US); Paul F. Smith, Oakville (CA)

(73) Assignee: Xerox Corporation, Norwalk, CT (US)

( * ) Notice: Subject to any disclaimer, the term of this patent is extended or adjusted under 35 U.S.C. 154(b) by 499 days.

(21) Appl. No.: 12/045,461

(22) Filed: Mar. 10, 2008

(65) Prior Publication Data

US 2009/0226605 A1 Sep. 10, 2009

(51) Int. Cl.
*H01Q 9/04* (2006.01)
*H01Q 9/00* (2006.01)

(52) U.S. Cl. .......... 427/123; 427/58; 427/117; 427/120; 427/125; 427/180; 427/189; 427/190; 427/191; 427/192; 427/96.1; 340/10.1; 340/10.52; 340/1.1; 340/500; 340/572.1

(58) Field of Classification Search ............ 427/180, 427/191, 192, 125
See application file for complete search history.

(56) References Cited

U.S. PATENT DOCUMENTS

| | | | |
|---|---|---|---|
| 5,204,681 A | 4/1993 | Greene | |
| 5,291,205 A | 3/1994 | Greene | |
| 5,581,257 A | 12/1996 | Greene et al. | |
| 5,661,484 A | 8/1997 | Shumaker et al. | |
| 5,882,722 A | 3/1999 | Kydd | |
| 5,891,240 A | 4/1999 | Greene | |
| 6,471,878 B1 | 10/2002 | Greene et al. | |
| 2004/0086885 A1* | 5/2004 | Lee et al. | 435/6 |
| 2005/0280504 A1 | 12/2005 | Pettus | |
| 2005/0280539 A1* | 12/2005 | Pettus | 340/572.1 |
| 2006/0163744 A1* | 7/2006 | Vanheusden et al. | 257/773 |
| 2006/0260493 A1 | 11/2006 | Travis et al. | |
| 2009/0142481 A1* | 6/2009 | Chopra et al. | 427/123 |

OTHER PUBLICATIONS

Tzhayik et al., "Xanthate Capping of Silver, Copper, and Gold Colloids", Langumir, vol. 18, (2002).*
Efrima et al., "Xanthates and Related Compounds as Versatile Agents in Colloid Science", C. R. Chimie, vol. 6, pp. 1035-1045, (2003).*
Ulmann, "Xanthate", Ulmann's Encyclopedia of Industrial Chemistry, pp. 1 and 4, (2005).*

* cited by examiner

*Primary Examiner* — Michael Cleveland
*Assistant Examiner* — Lisha Jiang
(74) *Attorney, Agent, or Firm* — Oliff & Berridge, PLC

(57) ABSTRACT

A process for printing conductive metal markings directly on a substrate under an ambient condition, including the steps of synthesizing or providing conductive the ink on a substrate to form conductive metallic nanoparticles into an ink; and printing the ink on a substrate to form conductive metallic markings on the substrate. The printed conductive metallic markings may form wires that behave as resonant RFID antenna applications.

10 Claims, No Drawings

SYNTHESIS OF CONDUCTIVE METAL MARKINGS FOR CHIPLESS RFID APPLICATIONS

TECHNICAL FIELD OF THIS INVENTION

The present disclosure relates to a process for printing conductive metal markings directly on a substrate under an ambient condition, comprising the steps of synthesizing or providing conductive metallic nanoparticles; formulating the metallic nanoparticles into an ink and printing the ink on a substrate to form conductive metal markings on the substrate. The printed conductive metal markings may form wires that behave as resonant RFID antennas.

BACKGROUND

Recently, radio frequency identification (RFID) technology has gained tremendous popularity as a device for storing and transmitting information. RFID technology utilizes a tag transponder, which is placed on an object, and a reader, also referred to herein as an interrogator, to read and identify the tag. RFID technologies are broadly categorized as using either "active" tags or "passive" tags. Active tags have a local power source (such as a battery) so that the active tag sends a signal to be read by the interrogator. Active tags have a longer signal range. Passive tags, in contrast, have no internal power source. Instead, passive tags derive power from the reader, and the passive tag re-transmits or transponds information upon receiving the signal from the reader. Passive tags have a much shorter signal range (typically less than 20 feet).

Both categories of tags have an electronic circuit that is typically in the form of an integrated circuit or silicon chip. The circuit stores and communicates identification data to the reader. In addition to the chip, the tag includes some form of antenna that is electrically connected to the chip. Active tags incorporate an antenna that communicates with the reader from the tag's own power source. For passive tags, the antenna acts as a transducer to convert radio frequency (RF) energy originating from the reader to electrical power. The chip then becomes energized and performs the communication function with the reader.

On the other hand, a chipless RFID tag has neither an integrated circuit nor discrete electronic components, such as the transistor or coil. This feature allows chipless RFID tags to be printed directly onto a substrate at lower costs than traditional RFID tags.

As a practical matter, RFID technology uses radio frequencies that have much better penetration characteristics to material than do optical signals, and will work under more hostile environmental conditions than bar code labels. Therefore, the RFID tags may be read through paint, water, dirt, dust, human bodies, concrete, or through the tagged item itself. RFID tags may be used in managing inventory, automatic identification of cars on toll roads, security systems, electronic access cards, keyless entry and the like.

Antennas are an element of RFID tags that are typically prepared via stamping/etching techniques, wherein a foil master is carved away to create the final structure. Additionally, the antenna may be formed via a lithographic press. See Travis et al., U.S. Patent Publication No. 2006/0260493.

The RFID antenna may also be printed directly on the substrate using a conductive metal ink, The ink is printed on a substrate, followed by high temperature sintering in order to anneal the particles and to create a conductive line on the substrate. Precisia, L.L.C., for example, produces both solvent- and water- based conductive inks that are formulated specifically for lithographic, gravure, rotary screen and flexographic printing.

DuPont's 5033 Conductive Ink is a conductive thick film paste, that allows for the screenprinting of an antenna onto a substrate.

Dow Coming's Highly Conductive Ink is also suitable for screenprinting. However, the inks require an additional curing step.

Paralec offers inks, pastes and toners under the trademark PARMODO®, that is printed onto a substrate, using conventional printing processes. After printing, the substrate must be cured to provide pure metallic conductors. However, the PARMOD® pastes are very viscous materials that are not suitable for digital printing applications such as inkjet printing. Similarly, a low-cost metal antenna comes from the collaboration between the England-based QinetiQ and Coates Screen. With the QinetiQ method of "growing" antennas, specially formulated ink is printed on a substrate material, such as cardboard or polystyrene. The substrate is then passed through an electroless solution, which uses chemicals, to deposit metal onto a surface. The metal in the solution reacts with chemicals in the ink, and forms deposits on the substrate where there is ink.

CARCLO® also offers conductive inkjet technology. However, the ink requires a UV curable component, a catalyst, and a wet eletroless plating step with corrosive metal baths HANITA COATINGS® develops and manufactures pure copper antennas and print substrates optimized for printing by conductive inks. Hanita's RFID antennas consist of heat stabilized PET films with a conductive ink receptive coating specifically to improve the adhesion of the conductive ink to the substrate. However this approach requires a multi-step process that involves vapor deposition of a base metal layer, followed by an insulation layer, and a wet electroplating step. This process is not amenable for direct printing on paper substrates in a single pass.

Alternatively, metal fibers may be incorporated directly into the substrate. For example, one chipless RFID technology from INKODE® uses embedded aluminum fibers that are embedded into paper and act as radar antenna. When subjected to radar waves (24 GHz super high frequency (SHF)), the fibers act as resonators, and backscattering of the waves occurs. A detector receives each of these backscattered waves, with the intensity being dependent on the volume, length and orientation of the fibers. Given a collection of such fibers in a random array, a "signature" pattern of backscatter is produced. This signature pattern can be converted with the appropriate algorithm to create a unique binary code that makes each tag unique. The INKODE® concept has several limitations. One drawback is that the fibers are embedded into the paper, and thus must be incorporated during the paper-making process as a furnish additive. Another drawback is that because aluminum fibers that are cut to the appropriate ¼ wavelength is required, the process is costly and tedious.

As a suitable metal material to be used in the ink, although particulate metal materials may be used in the ink preparation, the superior characteristics of metallic nanoparticle materials in ink applications yields a better product. Metallic nanoparticles are particles having a diameter in the submicron size range. Metallic nanoparticles have unique properties, which differ from those of bulk and atomic species. Metallic nanoparticles are characterized by enhanced reactivity of the surface atoms, high electric conductivity and unique optical properties. For example, metallic nanoparticles have both a lower melting point and a lower sintering temperature than that of bulk metal. In particular, this sharply reduced melting temperature of metallic nanoparticles make them especially suited for conductive ink applications.

Metallic nanoparticles are either crystalline or amorphous materials. They can be composed of pure metal, such as silver, gold, copper, aluminum, etc., or a mixture of metals, such as alloys, or core of one or more metals, such as copper covered by a shell of one or more other metals such as gold or silver. The nozzles in an inkjet printing head are approximately 1 μm in diameter. In order to jet a stream of particles through a nozzle, the size of a particle should be less than approximately one-tenth of the nozzle diameter. This means that in order to inkjet a particle, its diameter must be less than about 100 nm.

Nickel has been used for conductive inks for a very limited extent because of its relatively low conductivity (approximately 4 times less than that of copper or silver). Gold and silver can provide good conductivity, but are relatively expensive. Moreover, gold and silver require high temperatures for annealing, which can pose a challenge for printing on paper and plastic substrates. Copper provides good conductivity at a low price (about one percent of that of silver). Unfortunately, copper is easily oxidized and the oxide is non-conductive. Conventional copper-based nanoparticle inks are unstable and require an inert/reducing atmosphere during preparation and annealing in order to prevent spontaneous oxidation to non-conductive CuO or $Cu_2O$. Copper polymer thick film (PFT) inks have been available for many years and can be used for special purposes, for example, where solderability is required. Another interesting strategy is to combine the advantages of both silver and copper. Silver plated copper particles are commercially available, and are used in some commercially available inks. Silver plating provides the advantages of silver for inter-particle contacts, while using the cheaper conductive metal (copper) for the bulk of the particle material. Thus, the only reliable means of preparing copper antennas is via electroplating on an existing metal surface.

There exists a need for a more simplified and cost-effective method of printing conductive metal markings, in the form of an inkjet ink, directly onto a substrate under ambient conditions.

REFERENCES

U.S. Patent Publication No. 2005/0280504 (Pettus) describes a system for encoding and decoding information by use of radio frequency antennas. The system includes one or more interrogator devices and RFID data tags. The RFID data tags include a plurality of antenna elements that are formed on a substrate or directly on an object. The antenna elements are oriented and have dimensions to provide polarization and phase information, whereby this information represents the encoded information on the RFID tag. The interrogator device scans an area and uses radar imaging technology to create an image of a scanned area. The device receives re-radiated RF signals from the antenna elements on the data tags, whereby the data tags are preferably represented on the image. The re-radiated RE signals preferably include polarization and phase information of each antenna element, whereby the information is utilized using radar signal imaging algorithms to decode the information on the RF data tag.

U.S. Pat. No. 5,661,484 (Shumaker et al.) generally describes radar absorbing materials, and more specifically, the design of a radar-absorbing material having artificial dielectric properties achieved by using fibers having different conductivities.

U.S. Pat. No. 6,471,878 (Greene et al.) describes automatic identification targets having RF taggants formed from thin metal objects or dipoles.

U.S. Pat. No. 5,204,681 (Greene); U.S. Pat. No. 5,291,205 (Greene); U.S. Pat. No. 5,581,257 (Greene et al.); and U.S. Pat. No. 5,891,240 (Greene) describe automatic identification of items using RF signals. More specifically, they describe the production of RE responsive materials for use in such a system, RF responsive targets using such materials and systems for automatic RF identification of items by such targets.

U.S. Pat. No. 5,882,722 (Kydd) describes a thick film formed of a mixture of metal powders and metallo-organic decomposition (MOD) compounds in an organic liquid vehicle and a process for advantageously applying them to a substrate by silk screening or other printing technology. The mixtures preferably contain metal flake with a ratio of the maximum dimension to the minimum dimension of between 5 and 50.

U.S. Patent Publication No. 2006/0260493 (Travis et al.) describes a conductive ink containing conductive, metallic particulates that is printed onto a substrate by waterless printing on a lithographic press using a relief image plate in a flexographic coating unit or in a lithographic printing unit without a fountain solution, to provide a layer of conductive print on the substrate.

SUMMARY

An object of the present disclosure is to provide a process for printing conductive markings directly on a substrate, comprising the steps of; providing stabilized metallic nanoparticles, formulating the nanoparticles into an ink and printing the ink directly onto a substrate in order to create metal markings on the substrate. The printing process is performed under ambient conditions.

The advantages of the present disclosure are numerous. With the exception of a sintering step in which the printed markings are annealed to the substrate, the printing process of the present disclosure does not require additional processing steps. The ink is deposited directly on the substrate, and does not require adding additional chemicals, catalysts, or undergoing a curing step. Thus, the need for using corrosive or toxic reagents during the printing process is obviated. Finally, the process of the present disclosure may be performed under ambient conditions. The simplicity of this process is especially advantageous for printing on paper and cardboard packaging materials that cannot withstand wet processes or extremely high temperatures. Thus, the present disclosure provides for a simplified solution for printing applications that improves cost-effectiveness.

EMBODIMENTS

Generally, the present disclosure provides a process of printing conductive metal markings directly on a substrate comprising the steps of: providing stabilized metallic nanoparticles; formulating the nanoparticles into an ink; and printing the ink directly on a substrate, to create metal markings on said substrate, whereby the printing is performed under ambient conditions. The markings may generally form conductive wires that may behave as resonant RFID antennas. The method is now described in further detail below.

This disclosure is not limited to particular embodiments described herein, and some components and processes may be varied by one of ordinary skill in the art, based on this disclosure. The terminology used herein is for the purpose of describing particular embodiments only, and is not intended to be limiting.

In this specification and the claims that follow, singular forms such as "a," "an," and "the" include plural forms unless the content clearly dictates otherwise.

Providing Metallic Nanoparticles

In the first step of the process according to the present disclosure, metallic nanoparticles are provided. The metallic nanoparticles are desirably in the nanometer size range. For example, in embodiments, the metallic nanoparticles have an average particle size of from about 1 to about 500 nm, such as from about 1 to about 200 nm, or about 1 to about 50 nm, or about 2 to about 20 nm. Herein, "average" particle size is typically represented as $d_{50}$, or defined as the median particle size value at the $50^{th}$ percentile of the particle size distribution, wherein 50% of the particles in the distribution are greater than the $d_{50}$ particle size value, and the other 50% of the particles in the distribution are less than the $d_{50}$ value. Average particle size can be measured by methods that use light scattering technology to infer particle size, such as Dynamic Light Scattering. The particle diameter refers to the length of the pigment particle as derived from images of the particles generated by Transmission Electron Microscopy (TEM).

Suitable metallic nanoparticle materials may be, without limitation, aluminum, gold, silver, copper, platinum, palladium, a combination thereof, or others. For example, they may be silver powder, silver coated particles, titanium oxide, palladium, gold, allotropes of carbon or alloys or mixtures thereof. They may be provided by any source known in the art. If necessary, the metallic nanoparticles are stabilized by a stabilizer. For example, copper nanoparticles stabilized with a substituted dithiocarbonate as a stabilizer may be used. In another example, silver nanoparticles stabilized with organic acids or amines, such as oleic acid or oleylamine. In another example, gold particles capped with alkylthiol can be used.

The metallic nanoparticles can be prepared by any method known in the art, including ball-milling attrition of larger particles (a common method used in nano-sized pigment production), followed by annealing. Annealing is generally necessary because ball milling produces amorphous nanoparticles, which need to be subsequently crystallized into the required single crystal form. The nanoparticles can also be made directly by RF plasma. Appropriate large-scale RF plasma reactors are available from Tekna Plasma Systems. The nanoparticles can also be made by a number of in situ methods in solvents, including water.

The metallic nanoparticles may be in any shape. Exemplary shapes of the metallic nanoparticles can include, without limitation, needle-shape, granular, globular, spherical, amorphorous shapes, and the like.

Formulating the Metallic Nanoparticles Into an Ink

The metallic nanoparticles can be formulated into an ink composition, including inks used in conventional pens, markers, and the like, liquid ink jet ink compositions, solid or phase change ink compositions, and the like. For example, the metallic nanoparticles can be formulated into a variety of ink vehicles, including "low energy" solid inks with melt temperatures of about 60 to about 130° C., solvent-based liquid inks, and even aqueous inks.

The ink composition according to the present disclosure generally includes metallic nanoparticles and an ink vehicle, such as a carrier solvent, or a mixture of two or more carrier solvents.

Generally, suitable solvent or carrier media can be polar or non-polar. Solvents that are useful according to the present disclosure include, without limitation, amines, amides, alcohols, terpene alcohols, esters, water, ketones, ethers, aromatics, substituted aromatics, terpenes, essential oils, aldehydes, alkenes, unsaturated hydrocarbons, saturated hydrocarbons, mineral acids organic acids and bases. Other suitable solvents include, without limitation, N,N,-dimethylacetamide (DMAc), diethyleneglycol butylether (DEGBE), ethanolamine and N-methyl pyrrolidone, dichloromethane, MEK, toluene, ketones, benzene, chlorotoluene, nitrobenzene, dichlorobenzene, NMP (N-methylpyrrolidinone), DMA (dimethylacetamide), ethylene glycol, diethylene glycol, DEGBE (diethylene glycol butyl ether) and propylene glycol.

In some cases, the solvent can be a high melting point solvent, such as one having a melting point of at least about 30° C. and not greater than about 100° C. In one embodiment, a heated inkjet head can be used to deposit the metallic nanoparticle ink composition while in a flowable state, whereby the solvent solidifies upon contacting the substrate. Subsequent processing can then remove the solvent by other means and then convert the material to the final product, thereby retaining resolution. Suitable solvents can include waxes, high molecular weight fatty acids, alcohols, acetone, N-methyl-2-pyrrolidone, toluene, tetrahydrofuran and the like. Alternatively, the metallic nanoparticle ink composition may be a liquid at room temperature, wherein the substrate is kept at a lower temperature below the freezing point of the composition.

In the formulation of the ink step, about 0.5 to about 35 weight % of the metallic nanoparticles may be dispersed in an ink vehicle. In embodiments, about 20 weight % of the metallic nanoparticles may be dispersed in an ink vehicle. The ink provides improved conductivity of about 2× to about 40×, In embodiments, conductivity is improved 10×.

The viscosity of the ink according to the present disclosure is from about 1 centipoise to about 100 centipoise. In embodiments, the viscosity of the ink is from about 1 centipoise to about 10 centipoise. In other embodiments, the viscosity is from about 1 centipoise to about 3 centipoise. Here, viscosity is measured at 25° C.

Additional Additives

The ink may further contain one or more additives in conventional amounts for their known purposes. Suitable additives include, for example, one or more binding resins, one or more colorants, one or more waxes, one or more surfactants, a charge controlling agent for controlling the polarity of the composition; a fluidization agent such as colloidal silica; lubricants such as metal salts of fatty acids; silica; a spacing agent; a dryer; a dispersant; a humectant; a cross-linking agent; a stabilizer; a thickening agent; a gelatinizing agent; a defoaming agent and an initiator for photopolymerization. It is worth noting however, that additional additives, if not removed in the annealing step, will reduce the conductivity of the conductive feature.

Printing the Ink Directly on a Substrate

The metallic nanoparticle ink may generally be printed on a suitable substrate such as, without limitation, paper, glass art paper, bond paper, paperboard, Kraft paper, cardboard, semi-synthetic paper or plastic sheets, such as polyester or polyethylene sheets, and the like. These various substrates can be provided in their natural state, such as uncoated paper, or they can be provided in modified forms, such as coated or treated papers or cardboard, printed papers or cardboard, and the like.

Generally, the ink prints marking at a desired shape, size and angle. Additionally, the desired shape, size and angle may be coded for a binary number.

As a practical matter, the ink produced by the method according to this disclosure may generally be used to print conductive lines on a substrate for use in various applications, including forming antennae for use in RFID applications.

When printing wires for use in RFID applications, the size of the individual printed metal wires depends on the antenna type desired. For example, for forming conductive fiber antennas, the fibers can have dimensions ranging from about 4 μm to about 6 μm thick, from about 0.1 mm to about 2 mm wide, and from about 5 mm to about 10 mm long. The length of the fibers depend on the resonant frequency. The equation relating resonator length λ and frequency is expressed as λ=c/frequency, where c is the speed of light. Thus, for example, for a 25 GHz resonator, the wavelength is 12 mm. In order to function as a backscattering reflective antenna, a fiber having ¼ the wavelength, or 3 mm, is preferred. Likewise, since resonators of one-half wave dimensions at frequencies on the order of about 10 GHz to about 100 GHz are quite small, they may be used for uniquely identifying large numbers of targets. Of course, the length of the fibers will vary as a function of frequency.

In one embodiment, printed wires have a print thickness of from about 0.01 μm to about 5 μm and a print resistance of from about 10 ohms/square to about 10,000 ohms/square.

Annealing the Printed Ink

After printing the ink on a suitable substrate, annealing of the ink to the substrate can be done by suitable means in the art. Generally, the annealing is performed at a temperature of less than about 200° C. In one embodiment, the annealing is performed at from about 120° C. to about 170° C. In another embodiment, the annealing is performed at about 130° C. The substrate is heated at a time period in the range of about 1 to about 30 minutes. The printing and annealing steps are generally performed in an ambient environment. Generally, an ambient environment refers to a normal atmospheric air environment, not requiring the presence of an inert gas environment. In addition, the printing and annealing steps can be performed simultaneously or consecutively.

Optionally, additional processing steps, such as any of overcoating, drying and rinsing, alone or in combination, may follow the printing step.

For the optional overcoating step, any suitable overcoating may be applied after the printing process is completed. For example, a suitable overcoating can be applied to cover and protect the printed metal wires, such as to protect them from abrasion, chemical attack, or the like. When so applied, the overcoating can be of any desired thickness, opacity, transparency, or the like.

Additionally, an optional drying step may follow the precipitation and deposition of metal on the substrate. The metal precipitate is allowed to dry for about 5 minutes at 80° C.

Applications of the Present Disclosure

The present disclosure offers many possible applications. The printing process of this disclosure may be used to manufacture electronic and electrical circuit systems, including electrical interconnects and electrical and electronic components. Moreover, the printing process of this disclosure may be used to print electrical components, including resistors, capacitors, inductors, and RFID tags, as well as electric circuits. Additionally, the printing process of this disclosure may be used to print microwave strip line structures directly onto flexible substrates to form microwave integrated circuits (MICs), and microwave antennas. It should be noted that it is feasible to print any type of antenna with this galvanic process, including, for example, HF coils, UHF fan-shaped antennas, and fibers.

An example is set forth herein below and is illustrative of different compositions and conditions that can be utilized in practicing the disclosure. All proportions are by weight unless otherwise indicated. It will be apparent, however, that the disclosure can be practiced with many types of compositions and can have many different uses in accordance with the disclosure above and as pointed out hereinafter.

EXAMPLES

Example 1

Providing Stabilized Copper Nanoparticles

Preparation of 2-butoxyethyl xanthate Stabilizer

To a 3 neck 1 L round bottom flask equipped with a magnetic stir bar, 21 mL of 2-butoxyethanol (0.160 mol) was added. Following degassing with Ar for 15 min, 9 g of potassium hydroxide (KOH, 0.160 mol, 1 equiv.) was added. The reaction was stirred and heated to 100° C. until the KOH dissolved, forming a golden, viscous solution. Next, 10 mL of toluene was added, and the reaction was cooled to 0° C. with an ice bath. Then, 14 mL of carbon disulfide ($CS_2$, 0.23 mol, 1.43 equiv.) was slowly added, forming a yellow/orange suspension. The suspension was stirred for 1 hour, gradually warming up to room temperature. Finally, 400 mL of hexanes was added, and the reaction was stirred for an additional 4 hours. The reaction mixture was filtered through a Buchner funnel with filter paper, yielding a yellow precipitate. This precipitate was recrystallized from acetone hexanes, and filtered to give pure 2-butoxyethyl xanthate product as yellow needles (21 g, 0.092 mol, 57% yield).

Preparation of Xanthate Stabilized Copper Nanoparticles

In a 250 mL Erlenmeyer flask, 2 g of copper (II) nitrate ($Cu(NO_3)_2$, 10.7 mmol) was dissolved in 50 mL of deionized water to form a pale blue solution. Next, 3 g of 2-butoxyethyl xanthate (preparation described above, 12.8 mmol, 1.2 equiv.) was added, forming a blue/green solution. In a second 250 mL Erlenmyer flask, 3 g of sodium borohydride ($NaBH_4$, 80 mmol, 7.5 equiv.) was dissolved in 100 mL deionized water and cooled to 0° C. The $NaBH_4$ solution was added to the copper/xanthate solution with stirring, forming a dark brown suspension of copper nanoparticles. Next, 5.5 g of sodium dihydrogen phosphate ($NaH_2PO_4$, 46 mmol, 4.3 equiv.) was slowly added to the mixture, producing vigorous bubbling. Then, 100 mL of toluene was added, forming a biphasic mixture. This mixture was transferred to a separatory funnel, and the toluene layer was removed. The toluene extraction was repeated two more times, and the extracts were combined and concentrated in vacuo to furnish a dark brown viscous paste. The paste was redispersed in 5 mL of toluene, and filtered through a 1.2 μm nylon filter, changing filters as needed. The filtrate was concentrated in vacuo to yield 456 mg of copper nanoparticles (23% mass recovery).

Formulating the Metallic Nanoparticles Into an Inkjet Ink

The copper nanoparticle residue (preparation described above) was redispersed in 4 mL of 1,2-dichlorbenzene solvent to yield a brown solution containing 10 wt % copper nanoparticles.

Printing the Ink Directly on a Substrate

A 10 wt % copper nanoparticle ink solution (preparation described above) was loaded into a Dimatix printer cartridge, and an arbitrary pattern was jetted onto glossy coated photopaper preheated to 60° C. using 1 kHz drop frequency with 20 μm drop spacing with 4 jets. 10 ink layers were applied.

Annealing of the Printed Ink

The printed pattern was subjected to 3-stage heating (80° C. for 5 min, 110° C. for 5 min and 130° C. for 30 min). The pattern darkened after annealing, and became more lustrous, indicative of stabilizer decomposition, and subsequent annealing of the copper nanoparticles.

Conductivity Measurements

Conductivity measurements of the annealed printed pattern were $2.46 \times 10^3$ S/m, with a bulk sheet resistivity of 254 ohms/square.

Example 2

Preparing Stabilized Silver Nanoparticles

A mixture of silver trifluoroacetate (0.44 g, 2 mmol), oleic acid (4.24 g, 15 mmol), and tetrahydrofuran (THF, 20 mL) in a 100 mL flask was heated to 60° C. until silver salt dissolved. A solution of phenylhydrazine (0.12 g, 1.1 mmol) in THF (10 mL) was added dropwise to the above solution at 60° C. over a period of 5 min. The mixture was allowed to react at this temperature for another 20 min before cooling down to room temperature. The resulting viscous liquid was added to well-stirred methanol (100 mL) to precipitate the silver nanoparticle product, which was filtered, washed with methanol (3×50 mL), and air-dried to yield 0.18 g of oleic acid-stabilized silver nanoparticles (60.1% yield based on silver content of 72% as determined by TGA).

Annealing of the Silver Nanoparticles

A 15 wt % solution of the silver particles in toluene was spin-coated onto a glass slide at 1000 RPM, and heated at 210° C. for 20 minutes. The red-brown silver ink became a reflective silver mirror, indicative of coalescence of silver nanoparticles. The annealed film thickness ranged from 100-110 nm thick, with a measured conductivity (4-point probe) on the order of $10^4$ S/cm, and a sheet resistance of 90 ohms/square.

Formulating the Metallic Nanoparticles Into an Inkjet Ink

The silver nanoparticles were dispersed in either o-xylene or mesitylene solvent to yield a solution containing 15 wt % silver nanoparticles.

Printing and Annealing of the Silver Nanoparticles

The silver nanoparticle ink solution in mesitylene was printed using a Dimatix printer onto a glass slide using a drop spacing of 40 um. The printed ink film was 80 nm thick. Annealing at 210° C. for 20 minutes yielded a film with comparable results to the spin-coated film of silver ink (conductivity of $10^4$ S/cm).

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A method of printing conductive metal markings directly on a substrate comprising:
    formulating an ink containing metallic nanoparticles, the ink having a viscosity of about 1 to about 100 centipoise;
    printing the ink directly on the substrate under ambient conditions; and
    annealing the ink to create the metal markings on the substrate,
    wherein the metallic nanoparticles comprise copper nanoparticles stabilized with 2-butoxyethyl xanthate.

2. The method according to claim 1, wherein formulating the ink containing the metallic nanoparticles comprises dispersing about 0.5 to about 35 weight % of the metallic nanoparticles in an ink vehicle.

3. The method according to claim 1, wherein formulating the ink containing the metallic nanoparticles comprises dispersing about 20 weight % of the metallic nanoparticles in an ink vehicle.

4. The method according to claim 1, further comprising forming printed metal markings on the substrate by depositing on the substrate the ink containing the metallic nanoparticles using an inkjet printer or a solid ink printer.

5. The method according to claim 4, wherein the printed metallic markings are printed at a desired shape, size, and angle.

6. The method according to claim 5, wherein the printed metallic markings are coded for a binary number.

7. The method according to claim 1, wherein the printed metal markings form wires.

8. The method according to claim 7, wherein the wires form resonant RFID antennas.

9. The method according to claim 1, wherein the ink containing the metallic nanoparticles is annealed to the substrate at less than about 200° C.

10. The method according to claim 1, wherein the ink containing the metallic nanoparticles is annealed to the substrate at about 120° C. to about 170° C.

* * * * *